United States Patent
Yang

(10) Patent No.: US 7,346,101 B2
(45) Date of Patent: Mar. 18, 2008

(54) SPECTRUM MEASUREMENT SYSTEM COMPRISING PC AND POWER METER

(75) Inventor: Kuei Chi Yang, Hsinchu (TW)

(73) Assignee: D-Link Corporation, Hsinchu (TW)

( * ) Notice: Subject to any disclaimer, the term of this patent is extended or adjusted under 35 U.S.C. 154(b) by 848 days.

(21) Appl. No.: 10/724,042

(22) Filed: Dec. 1, 2003

(65) Prior Publication Data

US 2005/0117634 A1 Jun. 2, 2005

(51) Int. Cl.
*H04B 3/46* (2006.01)

(52) U.S. Cl. ...................................... 375/224
(58) Field of Classification Search ............... 375/224, 375/227, 316, 324, 344; 324/310, 312, 520, 324/667, 674, 681, 707, 508, 510, 511, 76.19, 324/76.56; 702/76; 342/192
See application file for complete search history.

(56) References Cited

U.S. PATENT DOCUMENTS 6,392,397 B1* 5/2002 Thomas ................. 324/76.11
2004/0042563 A1* 3/2004 Najarian et al. ............ 375/316

* cited by examiner

*Primary Examiner*—Sam K. Ahn
(74) *Attorney, Agent, or Firm*—Bacon & Thomas, PLLC

(57) ABSTRACT

A spectrum measurement system, comprising a preamplifier for receiving and pre-amplifying input signals from a wireless communication device; a down converter coupled to the preamplifier for decreasing frequencies of the input signals amplified and generating corresponding intermediate frequency (IF) signals; an IF filter coupled to the down converter for filtering the IF signals based on a predetermined frequency resolution and predetermined center frequency; a power meter coupled to the IF filter for measuring powers of the IF signals; and a personal computer coupled to the power meter via a first control interface operation to generate frequencies corresponding to the powers, the PC being operative to read frequencies, convert the frequencies into real frequencies based on a calibration table, and plot a frequency analysis graph.

5 Claims, 2 Drawing Sheets

SPECTRUM MEASUREMENT SYSTEM COMPRISING PC AND POWER METER

FIELD OF THE INVENTION

The present invention relates to spectrum measurement and more particularly to an improved spectrum measurement system comprising a PC (personal computer) and a power meter.

BACKGROUND OF THE INVENTION

The Internet, particularly WWW (World Wide Web) thereof, has known a rapid, spectacular development in recent years. WWW is used to provide a variety of multimedia services including voice, graphics, dynamic images, etc. in addition to a typical e-mail service. Accordingly, a substantial amount of data is accompanied with the multimedia services. As such, many network communication products of high performance are commercially available in which wireless communication products are the most interesting ones.

For designing and producing quality wireless communication products and ensuring that bandwidth occupied by such communication product is complied with the specifications, conventionally, an employee of a wireless communication product manufacturing company may measure spectrum of a wireless communication product to be finished and analyze the same, thereby ensuring that all products are defect free in order to comply with the specifications. For achieving this purpose, manufacturers of the art have to invest much money for establishing a spectrum test station having a dedicate spectrum analyzer in each assembly line. The spectrum analyzer is used to measure and analyze a wireless communication product to be finished.

In general, a spectrum analyzer for spectrum measurement may cost more than US$30,000. As such, the establishment of a number of spectrum test stations in several assembly lines may cost at least US$300,000. This inevitably will greatly increase the cost of the establishment of assembly lines. Hence, many not so rich enterprises are inhibited from investing the same for expansion. This has the drawback of delaying the normal delivery time if orders more than the normal production are received since all available assembly lines are full. Hence, a need for improvement exists.

SUMMARY OF THE INVENTION

A primary object of the present invention is to provide a spectrum measurement system comprising a PC and a power meter. The inexpensive spectrum measurement system has advantages of simple operation, easy maintenance, eliminating the cost of buying many expensive equipment for testing a wireless communication product in the automatic production line, and significantly increasing the competitiveness of the wireless communication products in the market. Further, by utilizing the present invention, the above drawbacks of the prior art such as expensive spectrum analyzers and high manufacturing cost of the wireless communication products can be overcome.

One object of the present invention is to provide a spectrum measurement system for measuring a spectrum of a wireless communication device to be finished. The spectrum measurement system comprises a preamplifier for receiving input signals from the wireless communication device to be measured and pre-amplifying the same; a down converter coupled to the preamplifier for decreasing a frequency of the amplified signals to an IF; an IF filter coupled to the down converter for receiving the IF signals from the down converter and filtering the same based on a predetermined frequency resolution and a predetermined center frequency; a power meter coupled to the IF filter for measuring a power of the IF signals; and a PC coupled to the power meter via a first control interface, the PC being operative to read the measured power from the power meter, convert the read measured frequency into a real frequency based on a created calibration table, take the real frequency as a frequency axis and the power as a power axis, and plot a frequency analysis graph with respect to the wireless communication device to be measured.

In one aspect of the present invention, the spectrum measurement system further comprises a scanning circuit coupled to the PC via a second control interface, the scanning circuit being operative to generate a predetermined waveform in response to a command from the PC; and a VCO coupled to the scanning circuit wherein an oscillation frequency of the VCO is controlled by a waveform sent from the scanning circuit, the VCO is operative to generate a local oscillation frequency capable of being linearly scanned back and forth in a predetermined frequency range, and the local oscillation frequency is sent to the down converter for mixing with the IF signals.

In another aspect of the present invention, the calibration table is created by coupling the measured wireless communication device selected from a series of wireless communication devices having a bandwidth complied with the specifications to the spectrum measurement system, and activating the PC to refer the read measured spectrum to a real spectrum of the wireless communication device.

The above and other objects, features and advantages of the present invention will become apparent from the following detailed description taken with the accompanying drawings.

DETAILED DESCRIPTION OF THE PREFERRED EMBODIMENTS

Figure 1:
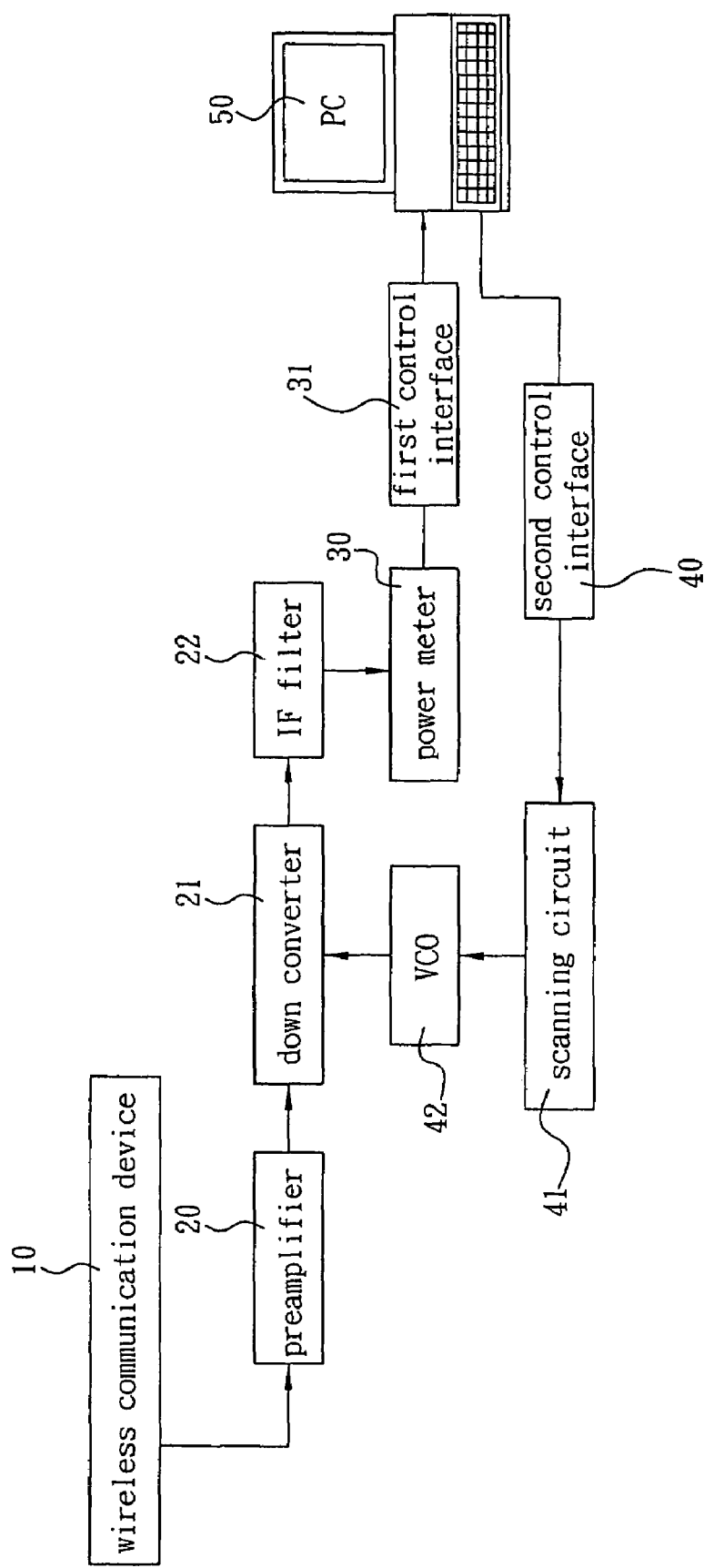
FIG. 1 is a block diagram of a preferred embodiment of spectrum measurement system according to the invention.

Referring to FIG. 1, there is shown a spectrum measurement system in accordance with the invention. The spectrum measurement system comprises a preamplifier 20 for receiving input signals from a wireless communication device 10 to be measured and pre-amplifying the same, a down converter 21 for decreasing the frequency of the amplified signals to IF (intermediate frequency), an IF filter 22 for receiving the IF signals from the down converter 21 and filtering the same to obtain IF signals required for measuring the wireless communication device 10 based on a predetermined frequency resolution, a power meter 30 for measuring powers of the IF signals, and a PC 50 coupled to the power meter 30 via a first control interface, wherein the first control interface 31 is operative to read the powers measured by the power meter and generate frequencies corresponding to the powers, and the PC 50 is adapted to read the frequencies received from the first control interface 31, convert the frequencies into real frequencies based on a preestablished calibration table, mark the real frequencies on a frequency axis and the powers on a power axis, and plot the frequency analysis graph with respect to the wireless communication device 10 to be measured.

For avoiding accumulated errors of the components from adversely affecting the truth of the measured spectrum in measuring the wireless communication device 10, the invention requires a system calibration to be conducted with respect to the spectrum measurement system for creating a calibration table prior to measuring the wireless communication device 10. Thus, the spectrum measurement system further comprises a scanning circuit 41 coupled to the PC 50 via a second control interface 40 so that the scanning circuit 41 can generate a desired waveform (e.g., triangular wave) in response to a command from the PC 50, send the waveform to a VCO (voltage control oscillator) 42 for controlling an oscillation frequency of the VCO 42 in order to cause the VCO 42 to generate a local oscillation frequency capable of being linearly scanned back and forth in a predetermined frequency range. In short, the PC 50 must receive input signals from the wireless communication device 10 and IF signals required for measurement in order to control the scanning circuit 41 so that a waveform created by the scanning circuit 41 is adapted to cause the VCO 42 to generate a local oscillation frequency as required.

The invention couples the measured wireless communication device 10 having a bandwidth complied with the specifications to the spectrum measurement system prior to creating a calibration table. As such, the PC 50 can refer the read measured spectrum to the real spectrum of the wireless communication device 10 for creating a required calibration table. In a preferred embodiment of the invention, the spectrum measurement system first measures a tested 802.11b wireless network card having a bandwidth complied with the specifications so that the PC 50 may send a control signal to the scanning circuit 41 via the second control interface 40 based on a predetermined center frequency 2,412 MHz of the wireless network card. Hence, the scanning circuit 41 is able to create a desired waveform for controlling an oscillation frequency generated by the VCO 42 to be linearly scanned back and forth in the frequency range from 2,412 MHz–150 MHz–22 MHz to 2,412 MHz–150 MHz+22 MHz. At this time, signals inputted from the wireless network card are pre-amplified at the preamplifier 20. Next, the amplified signals are mixed with the oscillation frequency generated by the VCO 42 at the down converter 21 (or mixer). At the moment, the IF signals obtained by decreasing frequency of the input signals will be filtered by the IF filter 22 to obtain a measured spectrum having a frequency resolution of 1 MHz and a center frequency of 150 MHz if the center frequency of the IF filter 22 is set as 150 MHz and the bandwidth thereof is set as 1 MHz respectively. Therefore, the PC 50 can refer the measured spectrum read by the power meter 30 to the real spectrum of the wireless network card for creating a calibration table as below.

| real frequency (MHz) | 2390 | 2391 | 2392 | 2393 | 2394 | 2395 | 2396 | 2397 | 2398 | 2399 | 2400 |
|---|---|---|---|---|---|---|---|---|---|---|---|
| measured frequency (MHz) | 128 | 129 | 130 | 131 | 132 | 133 | 134 | 135 | 136 | 137 | 138 |
| real frequency (MHz) | 2401 | 2402 | 2403 | 2404 | 2405 | 2406 | 2407 | 2408 | 2409 | 2410 | 2411 |
| measured frequency (MHz) | 139 | 140 | 141 | 142 | 143 | 144 | 145 | 146 | 147 | 148 | 149 |
| real frequency (MHz) | 2412 | 2413 | 2414 | 2415 | 2416 | 2417 | 2418 | 2419 | 2420 | 2421 | 2422 |
| measured frequency (MHz) | 150 | 151 | 152 | 153 | 154 | 155 | 156 | 157 | 158 | 159 | 160 |
| real frequency (MHz) | 2423 | 2424 | 2425 | 2426 | 2427 | 2428 | 2429 | 2430 | 2431 | 2432 | 2433 |
| measured frequency (MHz) | 161 | 162 | 163 | 164 | 165 | 166 | 167 | 168 | 169 | 170 | 171 |
| real frequency (MHz) | 2434 | | | | | | | | | | |
| measured frequency (MHz) | 172 | | | | | | | | | | |

By configuring as above, the spectrum measurement system can measure one of a series of wireless network cards. In detail, the PC 50 sends a control signal to the scanning circuit 41 via the second control interface 40 so that the scanning circuit 41 is able to create a desired waveform for controlling an oscillation frequency generated by the VCO 42 to be linearly scanned back and forth in the frequency range from 2,412 MHz–150 MHz–22 MHz to 2,412 MHz–150 MHz+22 MHz. Further, signals inputted from the wireless network card are pre-amplified at the preamplifier 20. Next, the amplified signals are mixed with the oscillation frequency generated by the VCO 42 at the down converter 21 prior to decreasing its frequency to IF. Next, the obtained IF signals are filtered by the IF filter 22 to obtain a measured spectrum having a frequency resolution of 1 MHz and a center frequency of 150 MHz. The power meter 30 then measures the power of the IF signals. Eventually, the PC 50 can read a plurality of measured frequencies and power values of the wireless network card as shown in the following table.

| measured frequency (MHz) | 128 | 129 | 130 | 131 | 132 | 133 | 134 | 135 | 136 | 137 | 138 |
|---|---|---|---|---|---|---|---|---|---|---|---|
| power (dBm) | −35 | −30 | −28 | −24 | −20 | −16 | −14 | −13 | −14 | −14 | −16 |
| measured frequency (MHz) | 139 | 140 | 141 | 142 | 143 | 144 | 145 | 146 | 147 | 148 | 149 |
| power (dBm) | −20 | −26 | −10 | 5 | 10 | 14 | 17 | 18 | 19 | 18 | 19 |
| measured frequency (MHz) | 150 | 151 | 152 | 153 | 154 | 155 | 156 | 157 | 158 | 159 | 160 |
| power (dBm) | 19 | 19.1 | 18.2 | 18.5 | 18 | 16 | 15 | 10 | 0 | −10 | −25 |
| measured frequency (MHz) | 161 | 162 | 163 | 164 | 165 | 166 | 167 | 168 | 169 | 170 | 171 |
| power (dBm) | −20 | −18 | −15 | −14 | −13 | −14 | −15 | −17 | −20 | −25 | −30 |
| measured frequency (MHz) | 172 | | | | | | | | | | |
| power (dBm) | −35 | | | | | | | | | | |

Figure 2:
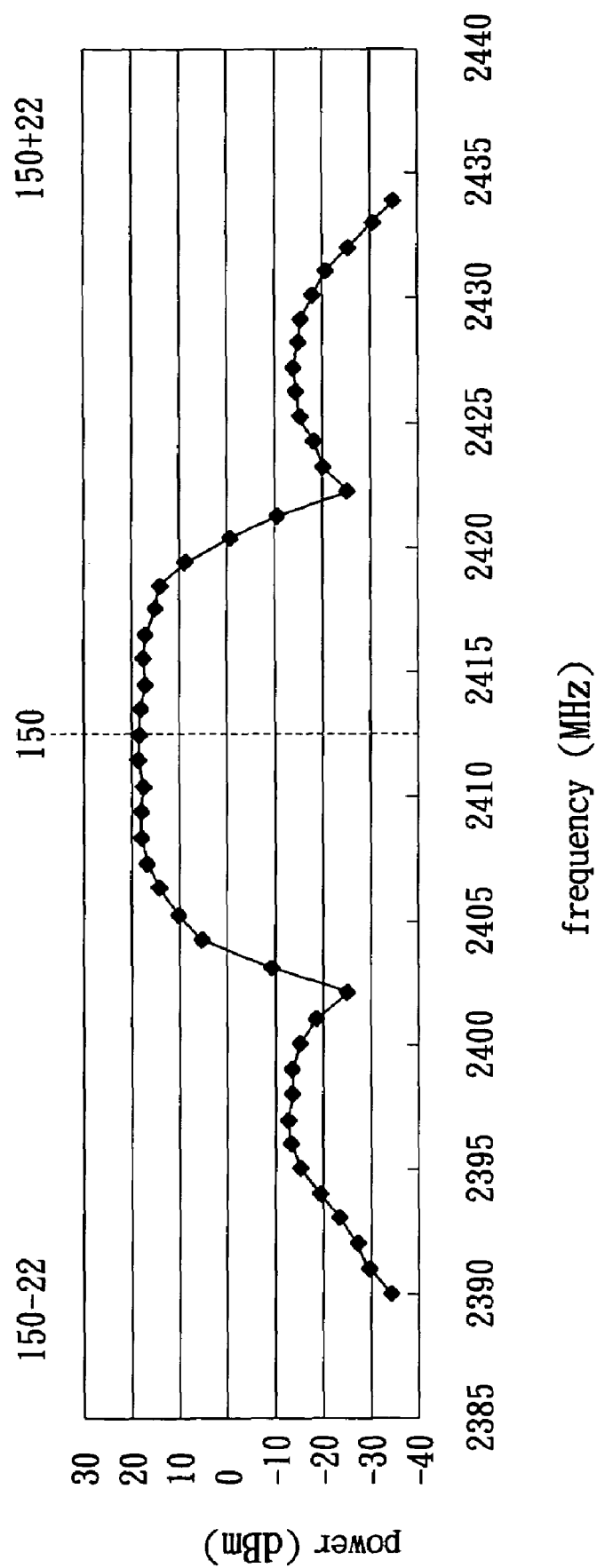
FIG. 2 plots power versus frequency for a real spectrum curve measured from a wireless network card produced according to the preferred embodiment of the invention.

At the moment, the PC 50 can take the measured frequency as X axis (i.e., frequency axis) and the power as Y axis (i.e., power axis) based on the read measured frequency and power for plotting a frequency analysis graph of the wireless network card. It is thus possible of converting the measured frequency into a real frequency and plotting a real frequency analysis graph of the wireless network card to be measured by referring the frequency analysis graph to the created calibration table. The real frequency analysis graph is best illustrated in FIG. 2.

In brief, the invention can establish a low cost while satisfying spectrum measurement system by assembling a number of commercially available electronic components with a PC. The spectrum measurement system is advantageous for being simple in operation. Further, buying and assembly of the components is easy. Furthermore, maintenance of the spectrum measurement system is easy. Most importantly, the measured scanning frequency and power, and the plotted real frequency analysis graph can be satisfactorily used by the designers and manufacturers of wireless communication product to measure the occupied bandwidth of one of a variety of wireless communication products as well as determining whether it is complied with the specifications.

While the invention has been described by means of specific embodiments, numerous modifications and variations could be made thereto by those skilled in the art without departing from the scope and spirit of the invention set forth in the claims.

What is claimed is:

1. A spectrum measurement system for measuring a spectrum of a wireless communication device, comprising:
   a preamplifier for receiving input signals from the wireless communication device and pre-amplifying the input signals;
   a down converter coupled to the preamplifier for decreasing frequencies of the input signals amplified and generating corresponding intermediate frequency (IF) signals;
   an IF filter coupled to the down converter for receiving the IF signals generated by the down converter and filtering the IF signals based on a predetermined frequency resolution and a predetermined center frequency;
   a power meter coupled to the IF filter for measuring powers of the IF signals received from the IF filter; and
   a personal computer (PC) coupled to the power meter via a first control interface, wherein the first control interface is operative to read the powers measured by the power meter and generate frequencies corresponding to the powers, and the PC is operative to read the frequencies received from the first control interface, convert the frequencies received from the first control interface into real frequencies based on a pre-established calibration table, mark the real frequencies on a frequency axis and the powers on a power axis, and plot a frequency analysis graph with respect to the wireless communication device.

2. The spectrum measurement system of claim 1, further comprising: a scanning circuit coupled to the PC via a second control interface, the scanning circuit being operative to generate a predetermined waveform in response to a command from the PC; and
   a voltage control oscillator (VCO) coupled to the scanning circuit, wherein an oscillation frequency of the VCO is controlled by a waveform sent from the scanning circuit, the VCO is operative to generate a local oscillation frequency capable of being linearly scanned back and forth in a predetermined frequency range, and the local oscillation frequency is sent to the down converter for mixing with the IF signals.

3. The spectrum measurement system of claim 2, wherein the pre-established calibration table is created by the PC, which is coupled to another wireless communication device selected from a series of wireless communication devices having a bandwidth complied with required specifications in accordance with the frequency of the another wireless communication device measured by the PC and a known real frequency of the another wireless communication device.

4. The spectrum measurement system of claim 2, wherein the spectrum measurement system is operative to measure the wireless communication device by performing operations comprising:
   commanding the PC to send a control signal to the scanning circuit via the second control interface;
   causing the scanning circuit to generate a predetermined waveform for controlling a local oscillation frequency generated by the VCO to be linearly scanned back and forth within the range of the predetermined frequency;
   pre-amplifying the input signals inputted by the wireless communication device at the preamplifier;
   decreasing the frequencies of the amplified input signals, which are mixed with the local oscillation frequency generated by the VCO, at the down converter for obtaining the IF signals;
   filtering the IF signals by the IF filter to obtain a measured spectrum having the predetermined frequency resolution and the predetermined center frequency;

activating the power meter to measure the power of the IF signals; and activating the PC to read a plurality of frequencies and power values received from the first control interface.

5. The spectrum measurement system of claim 4, wherein the PC is operative to mark the frequencies received from the first control interface on the frequency axis and the powers received from the first control interface on the power axis for plotting the frequency analysis graph of the wireless communication device, converting the frequencies received from the first control interface into the real frequencies based on the pre-established calibration table, and plotting the real frequency analysis graph of the wireless communication device in accordance with real frequencies.

* * * * *